United States Patent [19]
Fujiwara

[11] Patent Number: 4,924,398
[45] Date of Patent: May 8, 1990

[54] FAULT DIAGNOSIS SYSTEM FOR AUTOMOTIVE ELECTRONIC DEVICES

[75] Inventor: Toru Fujiwara, Himeji, Japan

[73] Assignee: Mitsubishi Denki Kabushiki Kaisha, Japan

[21] Appl. No.: 99,011

[22] Filed: Sep. 21, 1987

[30] Foreign Application Priority Data

Sep. 25, 1986 [JP] Japan ................................ 61-228730

[51] Int. Cl.$^5$ ............................................. G06F 15/74
[52] U.S. Cl. ................................ 364/431.11; 73/117.2
[58] Field of Search .................... 364/431.11; 123/351, 123/479, 486; 73/117.3, 119 A, 118.1, 117.2; 340/52 F, 52 R, 521; 371/15.1, 20.1

[56] References Cited

U.S. PATENT DOCUMENTS

| 4,325,251 | 4/1982 | Kanegae | 73/117.3 |
| 4,402,217 | 9/1983 | Higashiyama | 73/117.3 |
| 4,437,342 | 3/1984 | Hosaka et al. | 73/119 A |
| 4,442,424 | 4/1984 | Shirasaki et al. | 364/431.11 X |
| 4,612,615 | 9/1986 | Murakami | 364/431.07 |
| 4,627,275 | 12/1986 | Henein et al. | 73/112 |
| 4,764,884 | 8/1988 | Noyori | 364/431.11 X |

Primary Examiner—Eugene R. LaRoche
Assistant Examiner—Seung Ham
Attorney, Agent, or Firm—Leydig, Voit & Mayer

[57] ABSTRACT

A fault diagnosis system for automotive electronic devices, suitable for use in an automobile having at least one electronic device which is provided with a sensor for sensing the state of operation of at least one automotive part and an actuator for controlling the operation of the automotive part in accordance with the state sensed by the sensor, the electronic device having a self-diagnosis function for detecting any fault in said sensor or said actuator and for storing data concerning the detected fault. The fault diagnosis system has a diagnosis tester which includes an input circuit for receiving a fault detection signal which is produced as a result of self-diagnosis performed by the self-diagnosis function of said electronic device, a display control circuit for converting the fault detection signal received by the input circuit into a display control signal, a display for displaying, in accordance with said display control signal, data representing the sensor or said actuator having the fault, and a sound generating device receiving the display control signal for generating an aural alarm in response to a fault.

15 Claims, 2 Drawing Sheets

FAULT DIAGNOSIS SYSTEM FOR AUTOMOTIVE ELECTRONIC DEVICES

BACKGROUND OF THE INVENTION

The present invention relates to an improvement in a fault diagnosis system for automotive electronic devices.

A known fault diagnosis system for automotive electronic devices and its drawbacks will be described with reference to FIG. 1. Referring to FIG. 1, an automobile has electronic devices each having a self-diagnosis function and constituted by a controlling microcomputer, memory and other devices. The automobile also has sensors 2a, 2b and 2c which sense the operating conditions of various parts of an automobile and produce signals indicative of the sensed of operating conditions actuators, 3a, 3b and 3c operate in accordance with signals produced by the electronic devices 1a, 1b and 1c to control the operating conditions of the respective portions of the automobile. The automobile also has a connector 4 which is supplied with output signals from the electronic devices 1a, 1b and 1c. A warning lamp 6, is connected to the electronic devices 1a, 1b and 1c. These constituent elements of the fault diagnosis system are mounted on suitable portions of the automobile.

The diagnosis system has a fault diagnosis tester 5 which is connected to the electronic devices 1a, 1b and 1c through the connector 4, when it is desired to diagnose the states of the electronic devices. The tester 5 has operating keys 5b for reading data from the electronic devices 1a, 1b and 1c, and a display 5a designed for displaying data read from the selected electronic unit together with a code which identifies the electronic device.

As stated before, each of the electronic devices 1a, 1b and 1c has a self-diagnosis function so that it can sense any fault in its associated peripheral devices, i.e., the sensor and the actuator. The electronic device 1a, 1b or 1c, which happens to sense a fault in its associated peripheral part, stores in its memory (not shown) a code representing the faulty portion and data indicative of the fault, while turning the warning lamp 6 on. More specifically, the warning lamp 6 blinks as a switch (not shown) is turned on, and the number of blinks of the warning lamp is controlled in accordance with the code stored in the memory of the electronic device. It is therefore possible to find the faulty portion by counting the number of blinks.

For the purpose of conducting a diagnosis, the fault diagnosis tester 5 is connected to the electronic devices 1a, 1b and 1c through the connector 4. The operating keys 5b are operated in a predetermined sequence to successively select an electronic device 1a, 1b and 1c by inputting the code representing the respective electronic devices. Batches of data are read from the successive electronic devices and displayed on the display 5a of the tester 5. The thus-read batches of data are compared with normal data previously stored in the tester 5 and are suitably processed such that the display 5a displays the code indicative of the faulty electronic device.

In this known fault diagnosis system, the functions of the diagnosis tester 5 are independent from the self-diagnosis function of each of the electronic devices 1a, 1b and 1c. The user cannot be informed of the occurrence of a fault and cannot determine the portion where the fault exists, unless he operates the keys 5b after connecting the tester 5 to the connector 4, even when at least one of the electronic devices 1a, 1b and 1c is outputting a defect detection signal and the code signal representing the faulty portion. For example, it cannot be determined from the code representing device 1a whether the fault resides in its sensor 2a (or 2b or 2c) or in its actuator 3a (or 3b or 3c) upon detection of the fault by its self-diagnosis function.

In general, fault diagnosis requires not only the identification of the faulty portion but also an analysis of the cause of the fault. Fault analysis requires various data such as identification of the faulty part, when the fault took place, under what conditions the fault occurs, and so forth. This in turn requires that one or more engineers who are skilled in fault diagnosis, in addition to the test driver, be present in an automobile during a test drive, because there are so many items to be checked during a test drive. For instance, it is necessary to watch the state of the warning lamp to check under what conditions the warning lamp lights up, and also to read the number of blinks exactly to identify the faulty part, while correctly manipulating the diagnosis tester in accordance with a predetermined sequence or program.

Thus, the known fault diagnosis system requires a plurality of skilled persons at one time, and an impractically long time for determining the faulty portion and the cause of the fault.

SUMMARY OF THE INVENTION

Accordingly, an object of the present invention is to provide an improved fault diagnosis system for automotive electronic devices, which makes it possible to instantaneously detect the timing or condition of occurrence of a fault and the portion of the automobile in which the fault has taken place, thereby overcoming the above-described problems of the prior art.

To this end, according to the present invention, there is provided a fault diagnosis system for automotive electronic devices, in which, in the event of a failure, the self-diagnosis function of one of the electronic devices transmits a code signal indicative of the faulty part. The code signal is directly received by the diagnosis tester which in turn displays the content of the code signal while activating an aural alarm so as to inform the engineer of the occurrence of the fault.

In this fault diagnosis system, when a fault has taken place in the sensor or the actuator, the associated electronic device detects the fault by its self-diagnosis function and produces the fault detection signal representing the result of the self-diagnosis. The thus produced defect detection signal is directly received by the diagnosis tester which generates a sound to inform the engineer of the occurrence of the fault while showing the code representing the faulty portion. The engineer thereby is informed of the portion of the automobile in which the fault is taking place.

The above and other objects, features and advantages of the present invention will become clear from the following description of the preferred embodiment when the same is read in conjunction with the accompanying drawings.

DESCRIPTION OF THE PREFERRED EMBODIMENT

Figure 1:
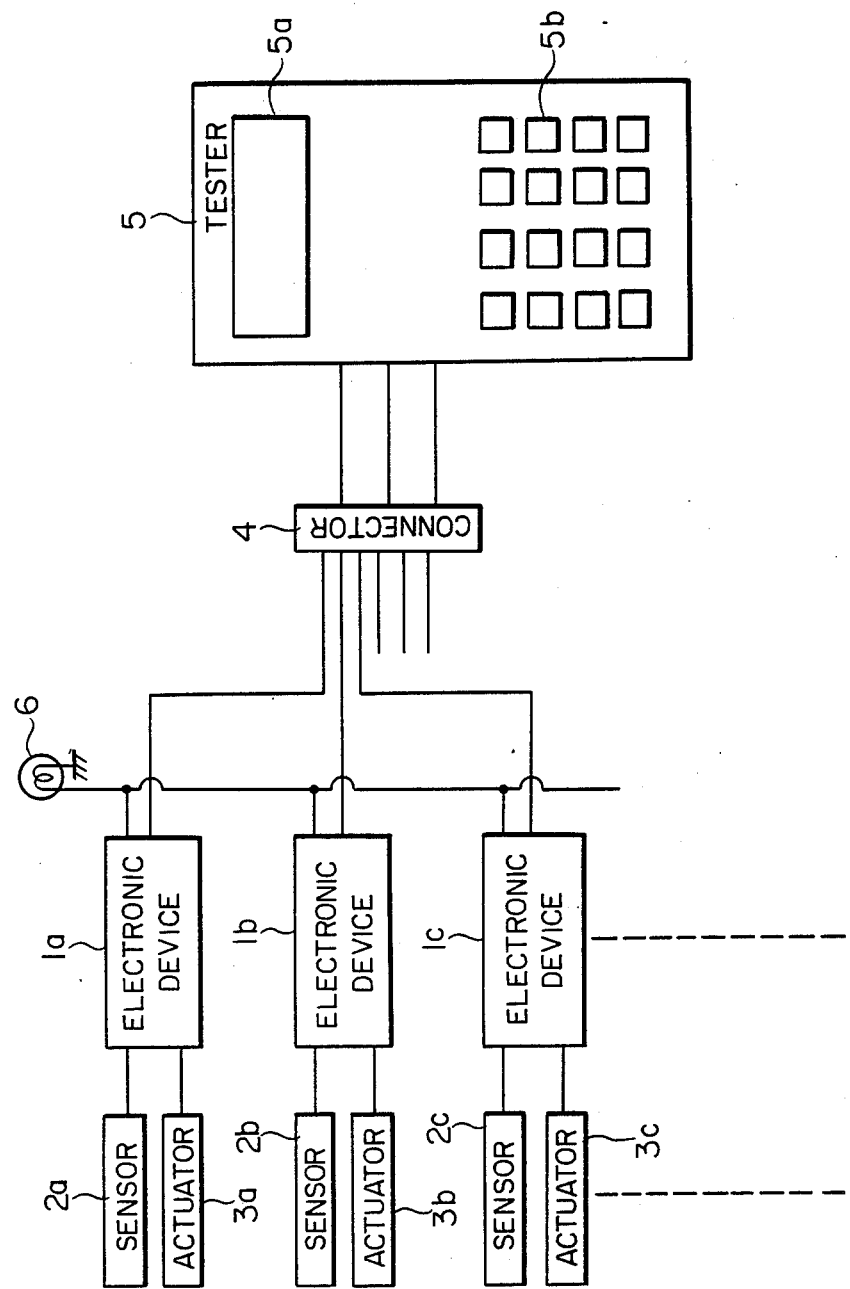
FIG. 1 is a block diagram showing a known fault diagnosis system for automotive electronic devices.
Figure 2:
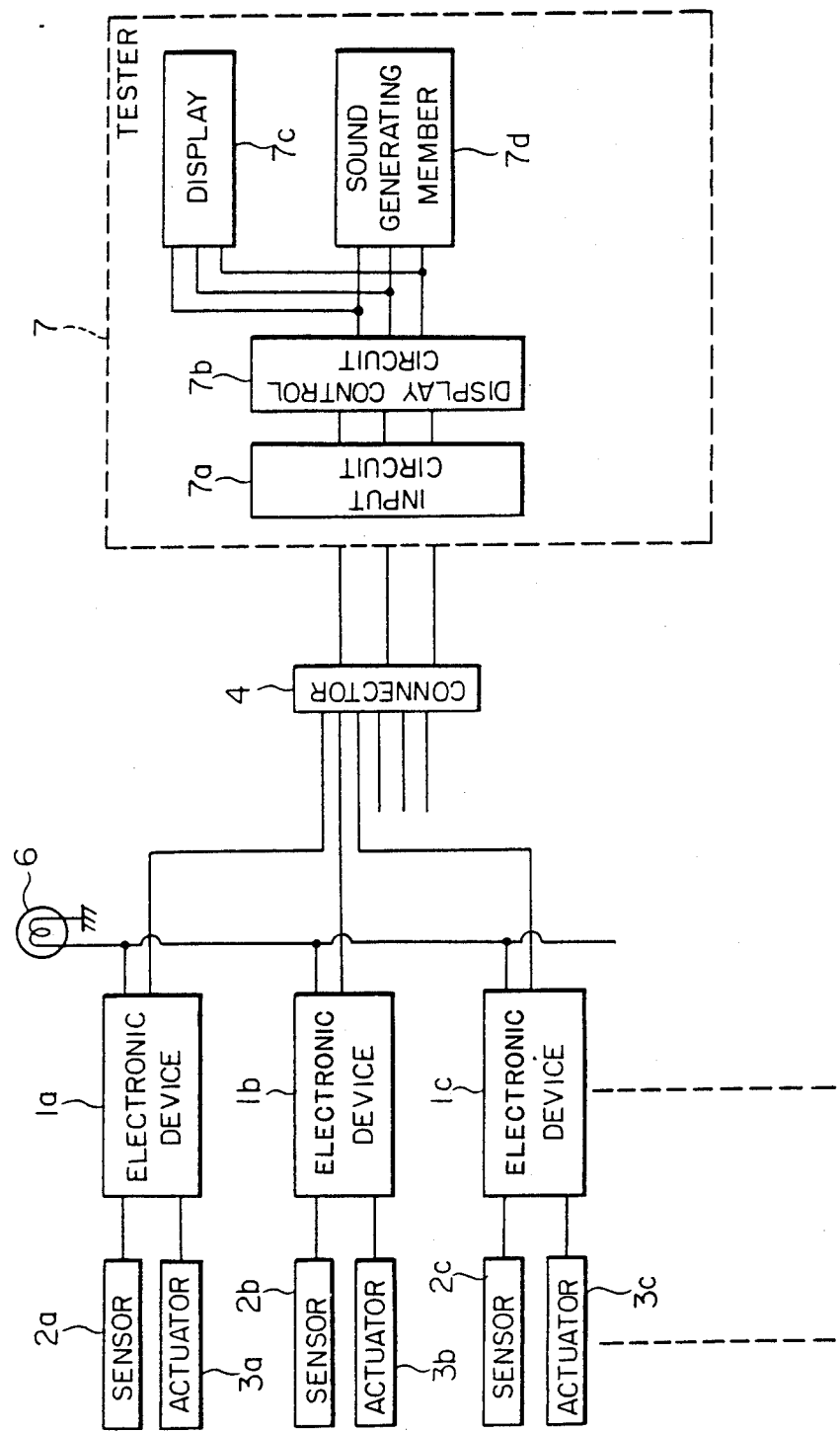
FIG. 2 is a block diagram of an embodiment of the fault diagnosis system for automotive electronic devices in accordance with the present invention.

A preferred embodiment of the present invention will be described hereinunder with reference to FIG. 2. An automobile has electronic devices 1a, 1b and 2c, sensors 2a, 2b and 2c, actuators 3a, 3b and 3c and a connector 4 which are materially the same as those explained before in connection with FIG. 1.

This embodiment of the fault diagnosis system has a diagnosis tester 7. The diagnosis tester 7 has an input circuit 7a for receiving the fault detection signal representing the result of the self-diagnosis performed by each of the electronic devices 1a, 1b and 1c. Tester 7 also includes a display control circuit 7b for converting the signal received by the input circuit 7a into a display control signal and a display 7c for displaying the code indicative of the faulty part in response to the display control signal generated by the display control circuit 7b, a sound generating device 7d for generating an aural alarm responds to the display control signal generated by the display control circuit 7b.

The fault diagnosis system, when used, is mounted on the automobile to be tested, and is connected to the electronic devices 1a, 1b and 1c through the connector 4. In the event a fault exists in any one of the sensors 2a, 2b and 2c or in one of the actuators 3a, 3b and 3c, the associated electronic device 1a, 1b or 1c senses the fault by its self-diagnosis function and produces a fault detection signal. The fault detection signal includes both a code signal for identifying the part in which the fault is taking place and data concerning the fault. The thus produced fault detection signal, including both the code signal and the fault data, is received by the input circuit 7a of the diagnosis tester 7 through the connector 4. The thus received signal is converted into a display control signal by the display control circuit 7b. The display control signal activates the display 7c to display the code identifying the faulty part. The display 7c lets the engineer recognize the part in which the fault is taking place. The display control circuit 7b operates the sound generating device 7d thereby generating an aural alarm to inform the operator of the occurrence of the fault. The sound generating device may be supplemented by a warning lamp receiving the display control signal from display control circuit 7b. The warning lamp lights when the aural alarm sounds as a further indication of a detected fault.

The engineer, therefore, can know the timing or condition under which the defect appears, as well as in what part the fault is taking place, simply by monitoring the display 7c on the diagnosis tester 7.

The sound generating device may be a buzzer capable of generating a suitable aural alarm. The sound generating device may be constructed such that it generates different aural alarms, such as different tones or durations, according to the portions or parts which are judged as being faulty. It is also possible to use a voice synthesizer as the sound generating device. In such a case, a synthetic voice is generated to enunciate the name of the part in which the fault is taking place.

It is not essential that the sound generating device 7d be incorporated in the body of the diagnosis tester. For instance, the sound generating device may be constructed separately from the diagnosis tester 7 and mounted in a suitable portion of the automobile, e.g., an instrument panel in front of the driver's seat of the automobile.

It is possible even to provide both the display 7c and the sound generating device 7d on suitable portion of the automobile.

In addition, the display control circuit 7b and the display 7c may be modified so that the display 7c displays the name of the faulty part rather than the code indicative of the defective part.

Although the invention has been described through its specific forms, it is to be understood that the described embodiment is only illustrative and various changes and modifications may be imparted thereto without departing from the scope of the invention which is limited solely by the appended claims.

What is claimed is:

1. In an automobile having a plurality of electronic devices, each of which is provided with a sensor for sensing the state of operation of at least one automotive part and an actuator for controlling the operation of the respective automotive part in accordance with the state sensed by the sensor, each of said electronic devices having a self-diagnosis function for detecting any fault in the respective sensor and actuator and for storing data concerning a detected fault, a fault diagnosis system for diagnosing the state of said electronic devices comprising a diagnostic tester including:

an input circuit for receiving fault detection signals produced by the self-diagnosis function of each of a plurality of electronic devices, each operatively connected to a respective sensor and an actuator;

a display control circuit receiving the fault detection signals from said input circuit for converting the fault detection signals into display control signals;

display means for automatically displaying, in response to said display control signals, data identifying which of the sensors and actuators have faults; and sound generating means receiving said display control signals for producing an aural alarm in response to the display control signals.

2. A fault diagnosis system according to claim 1, wherein said sound generating means includes a buzzer.

3. A fault diagnosis system according to claim 1 wherein said sound generating means includes a voice synthesizer.

4. A fault diagnosis system according to claim 1 wherein said sound generating means is disposed separately from other portions of said diagnostic tester.

5. A fault diagnosis system according to claim 4 wherein said sound generating means includes a buzzer.

6. A fault diagnosis system according to claim 4 wherein said sound generating means includes a voice synthesizer.

7. A fault diagnosis system according to claim 1 wherein said sound generating means and said display are disposed separately from other portions of said diagnostic tester.

8. A fault diagnosis system according to claim 7 wherein said sound generating means includes a buzzer.

9. A fault diagnosis system according to claim 7 wherein said sound generating means includes a voice synthesizer.

10. A fault diagnosis system according to claim 1 further comprising a warning lamp turned on in response to said fault.

11. A fault diagnosis system according to claim 10 wherein said sound generating means includes a buzzer.

12. A fault diagnosis system according to claim 10 wherein said sound generating means includes a voice synthesizer.

13. A fault diagnosis system according to claim 10 wherein said sound generating means is disposed separately from other portions of said diagnosis tester.

14. A fault diagnosis system according to claim 10 wherein said sound generating means and said display are disposed separately from other portions of said fault diagnostic tester.

15. A fault diagnosis system according to claim 1 wherein said diagnostic tester is connectable to said electronic devices through a single connector.

* * * * *